(12) United States Patent
Gianesello

(10) Patent No.: US 7,986,210 B2
(45) Date of Patent: Jul. 26, 2011

(54) INDUCTOR WITH A DECREASED SURFACE AREA AND AN IMPROVED ABILITY TO CONDUCT STRONG CURRENTS

(75) Inventor: Frederic Gianesello, Crolles (FR)

(73) Assignee: STMicroelectronics, SA, Montrouge (FR)

( * ) Notice: Subject to any disclaimer, the term of this patent is extended or adjusted under 35 U.S.C. 154(b) by 17 days.

(21) Appl. No.: 12/584,510

(22) Filed: Sep. 8, 2009

(65) Prior Publication Data

US 2010/0073118 A1    Mar. 25, 2010

(30) Foreign Application Priority Data

Sep. 23, 2008 (FR) ..................................... 08 56395

(51) Int. Cl.
*H01F 5/00* (2006.01)
(52) U.S. Cl. ......................... 336/200; 336/223; 336/232
(58) Field of Classification Search .................. 336/200, 336/223, 232
See application file for complete search history.

(56) References Cited

U.S. PATENT DOCUMENTS

| 5,610,433 A * | 3/1997 | Merrill et al. ................. 257/531 |
| 6,870,457 B2 * | 3/2005 | Chen et al. .................... 336/200 |
| 2004/0075521 A1 * | 4/2004 | Yu et al. ........................ 336/200 |
| 2004/0140878 A1 | 7/2004 | Heima |

* cited by examiner

*Primary Examiner* — Anh T Mai
(74) *Attorney, Agent, or Firm* — The Noblitt Group, PLLC

(57) ABSTRACT

An inductor formed in a stacking of insulating layers. The inductor comprises first and second access terminals, at least first and second interlaced loops on a first level, and at least third and fourth interlaced loops on a second level distinct from the first level. The third loop is the symmetrical of the first loop with respect to a plane. The fourth loop is the symmetrical of the second loop with respect to said plane. The internal ends of the first and second loops are connected to the internal ends of the third and fourth loops. The external ends of the first and third loops are connected to the first and second access terminals. The external ends of the second and fourth loops are interconnected.

10 Claims, 3 Drawing Sheets

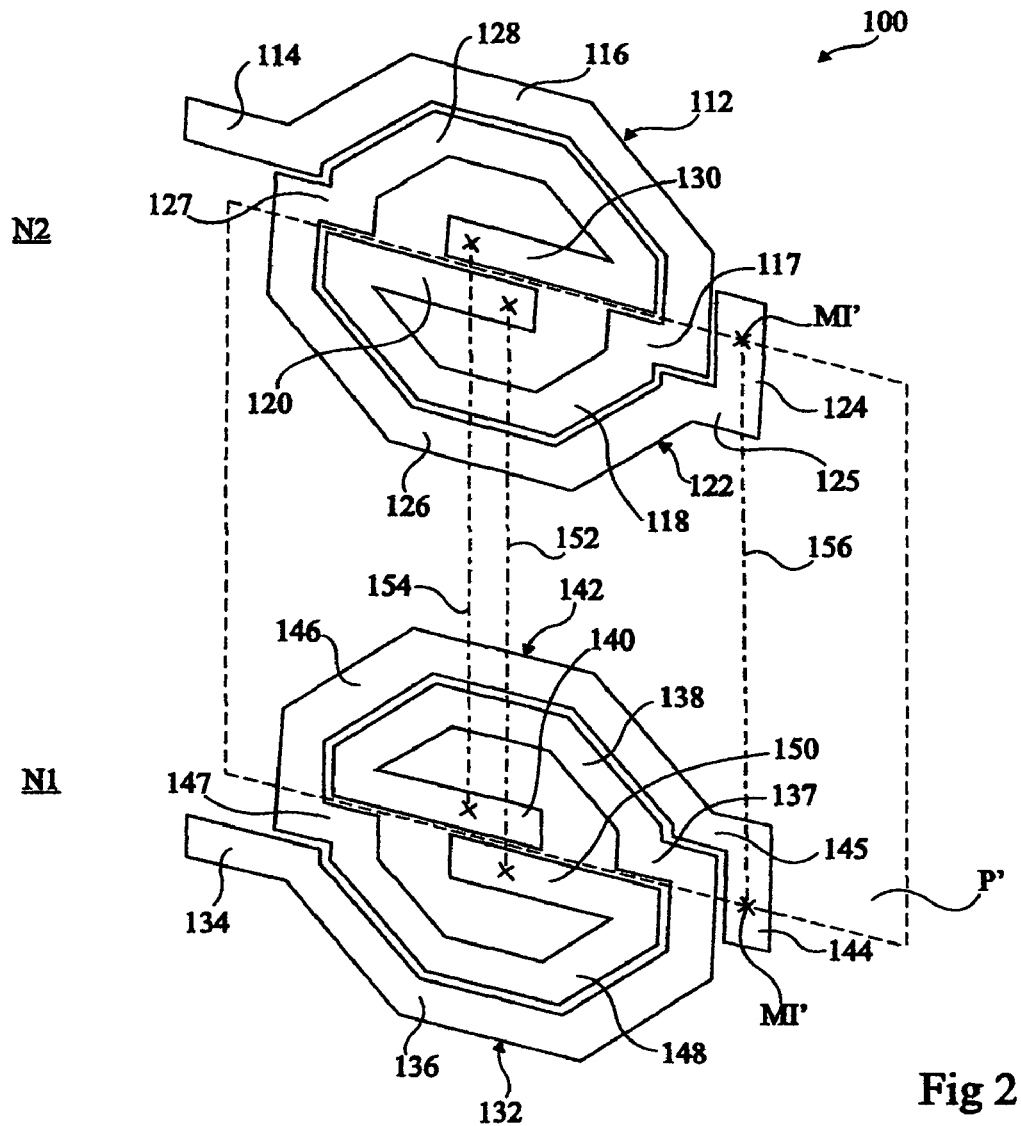
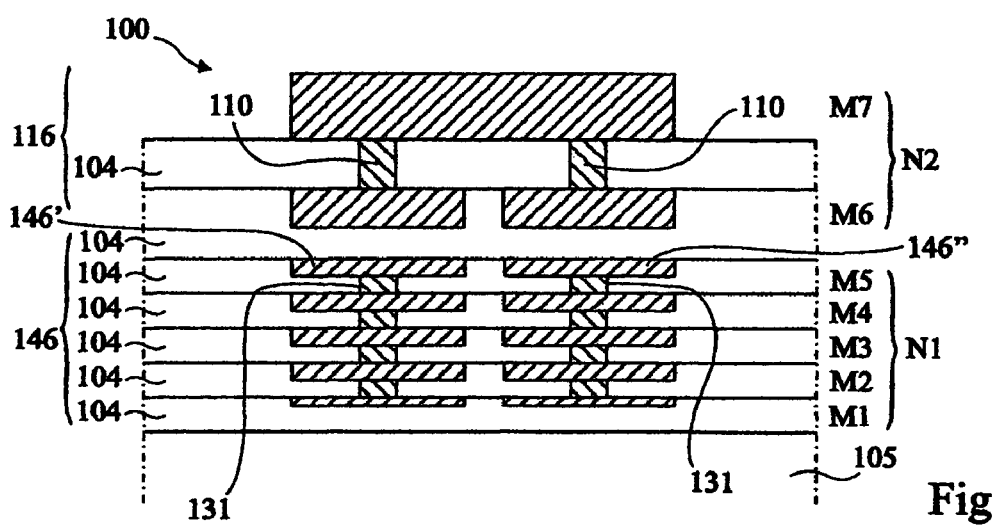
Fig 2
Fig 3

INDUCTOR WITH A DECREASED SURFACE AREA AND AN IMPROVED ABILITY TO CONDUCT STRONG CURRENTS

CROSS REFERENCE TO RELATED PATENT APPLICATIONS AND PATENTS

This application relates to application Ser. No. 12/218,670 filed on Jul. 17, 2008 by the applicant of the present invention, assigned to the same assignee, and hereby incorporated into the present application.

BACKGROUND OF THE INVENTION

1. Field of the Invention

The present invention relates to a specific inductor structure intended to be used, for example, in power amplifiers, transformers, etc.

2. Discussion of the Related Art

To obtain an inductor of high inductance which takes up a decreased surface area, a possibility is to form the inductor loops with metal tracks, belonging to different metallization levels, which are more or less stacked up along a privileged direction.

For certain applications, it is necessary for the inductor to further enable the conduction of strong currents. Such may be the case when the inductor is used in a power amplifier. As an example, a power amplifier made in integrated form based on MOS transistors may comprise a succession of amplification stages, among which an output amplification stage having its output corresponding to the gate of a MOS transistor and having its output corresponding to the drain of this transistor. An inductor is then generally provided between the drain and a source of a reference potential. This inductor must have a high inductance and enable the conduction of strong currents. As an example, when such an amplifier is used for the amplification of an oscillating signal at 2.4 GHz, it may be desirable for the inductor to enable the conduction of a 120-mA current at 80° C. It is in practice difficult to make, in integrated form, an inductor which at the same time takes up a decreased surface area, has a high inductance, and enables the conduction of strong currents.

An inductor generally comprises two main access terminals. For certain applications, in addition to the main access terminals, it is desirable to have an additional access terminal at the level of a specific point of the inductor for which the voltage between the additional access terminal and one of the main access terminals is opposite to the voltage between the additional access terminal and the other main access terminal. Such a point is called the inductor midpoint and the additional access terminal is called a differential access terminal. The midpoint actually corresponds to the point of the inductor for which the inductive and resistive components of the inductor between one of the main access terminals and the midpoint are identical, respectively, to the inductive and resistive components of the inductor between the midpoint and the other main access terminal.

It is desirable for the inductor to have a structure enabling to simply and systematically determine the position of the midpoint. As an example, when the inductor is formed of a single circular loop, with the two opposite ends of the loops forming the main access terminals, the midpoint corresponds to the loop point diametrically opposite to the main access terminals. However, as soon as the inductor comprises loops formed by metal tracks of several metallization levels, it may be difficult to simply and systematically determine the position of the midpoint. A difficulty is due to the fact that the materials used to form the metal tracks may be different from one metallization level to the other. As an example, for certain CMOS manufacturing processes, aluminum may be used for the last metallization level while copper may be used for the other metallization levels. Another difficulty is due to the fact that the thicknesses of the metal tracks may be different from one metallization level to another.

It is further desirable for the midpoint to be easily accessible, that is, generally, for the midpoint to be on a loop located at the level of the inductor circumference.

SUMMARY OF THE INVENTION

The present invention aims at obtaining an inductor formed by metal tracks of several metallization levels and enabling the conduction of strong currents.

According to another feature of the present invention, the inductor comprises a midpoint which can be easily determined.

According to another feature of the present invention, the inductor may be formed by conventional integrated circuit manufacturing methods.

To achieve all or part of these features, as well as others, an embodiment of the present invention provides an inductor formed in a stacking of insulating layers. The inductor comprises first and second access terminals, at least first and second interlaced loops on a first level, and at least third and fourth interlaced loops on a second level distinct from the first level. The third loop is, in top view, the symmetrical of the first loop with respect to a plane. The fourth loop is, in top view, the symmetrical of the second loop with respect to said plane. The internal ends of the first and second loops are connected to the internal ends of the third and fourth loops. The external ends of the first and third loops are connected to the first and second access terminals. The external ends of the second and fourth loops are interconnected.

According to an embodiment of the present invention, the inductor comprises a midpoint at the junction connecting the external end of the second and fourth loops.

According to an embodiment of the present invention, the first loop comprises a first internal end and a second external end. The second loop comprises a third internal end and a fourth external end. The third loop comprises a fifth internal end and a sixth external end. The fourth loop comprises a seventh internal end and an eighth external end. The first end is connected to the seventh end, the second end being connected to the first access terminal, the third end being connected to the fifth end, the fourth end being connected to the eight end and the sixth end being connected to the second access terminal.

According to an embodiment of the present invention, a metallization level from among several metallization levels is associated with each insulating layer, at least one of the first or second half-loops comprising at least two tracks of different metallization levels aligned along the stacking direction of the insulating layers and connected to each other along their entire length.

According to an embodiment of the present invention, the inductor comprises metal tracks of at least one first and one second metallization level. The inductor further comprises:
 in the first metallization level:
  a first portion forming a first half-loop and connected to the first access terminal;
  a second portion forming a second half-loop and connected to the first portion;

a third portion forming a third half-loop, symmetrical to the first portion with respect to said plane and extending along the external edge of the second portion; and a fourth portion forming a fourth half-loop, symmetrical to the second portion with respect to said plane, the first portion extending along the external edge of the fourth portion; and in the second metallization level:

a fifth portion forming a fifth half-loop and connected to the second access terminal;

a sixth portion forming a sixth half-loop and connected to the fifth portion;

a seventh portion forming a seventh half-loop, symmetrical to the fifth portion with respect to said plane and extending along the external edge of the sixth portion; and an eighth portion forming an eighth half-loop, symmetrical to the sixth portion with respect to said plane, the fifth portion extending along the external edge of the eighth portion.

According to an embodiment of the present invention, in top view, the first portion is aligned with the seventh portion, the second portion being aligned with the eighth portion, the third portion being aligned with the fifth portion, and the fourth portion being aligned with the sixth portion.

According to an embodiment of the present invention, the second portion is connected to a first rectilinear portion extending along said plane, on one side of said plane, all the way to the central portion of the inductor. The fourth portion is connected to a second rectilinear portion extending along said plane, on the side opposite to said plane, all the way to the central portion of the inductor.

According to an embodiment of the present invention, the fourth end of the second loop is located opposite to the first access terminal with respect to the center of the inductor. The eighth end of the fourth loop is located opposite to the second access terminal with respect to the center of the inductor.

An embodiment of the present invention also provides an electronic device comprising at least one inductor such as defined hereabove.

The foregoing features, and structural as well as functional aspects of the present invention will be discussed in detail in the following non-limiting description of specific embodiments in connection with the accompanying drawings.

BRIEF DESCRIPTION OF THE DRAWINGS

FIG. 2 is a simplified perspective view of the metal tracks of an embodiment according to the present invention of an inductor with four loops, formed on two loop levels;

FIG. 3 is a partial simplified cross-section view of the inductor of FIG. 2;

DETAILED DESCRIPTION

Figure 1:
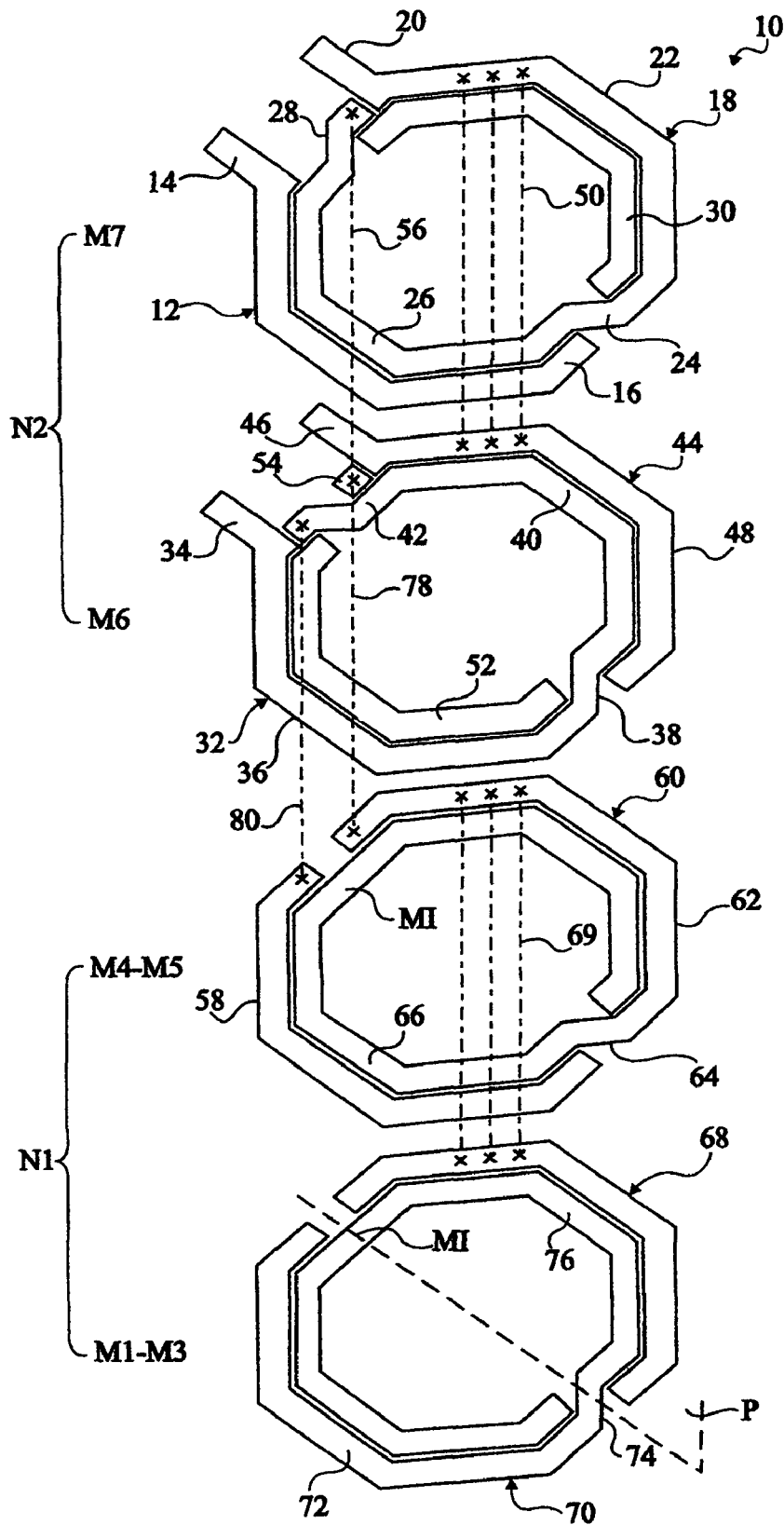
FIG. 1 is a simplified perspective view of the metal tracks of an embodiment according to the present invention of a conventional inductor with four loops, formed on two loop levels.

For clarity, the same elements have been designated with the same reference numerals in the different drawings and, further, as usual in the representation of integrated circuits, the various drawings are not to scale.

In the following description, inductors formed in a circuit comprising a stacking of insulating layers covering a substrate are considered. Metal tracks of a given metallization level are associated with each insulating layer. Call first metallization level the metallization level used to form the inductor for which the tracks are closest to the substrate, and last metallization level the metallization level used to form the inductor for which the tracks are most distant from the substrate. A loop of an inductor corresponds to one or several metal tracks, possibly of different metallization levels, connected to one another to be electrically equivalent to a single loop-shaped track. A half-loop corresponds to one or several metal tracks, possibly of different metallization levels, connected to one another to be electrically equivalent to a single track having the shape of a half-loop.

Further, in the following description, a metal track of a given metallization level is said to be aligned with a metal track of another metallization level if, when seen along the stacking direction of the insulating layers, the tracks substantially completely overlap. A metal track of a given metallization level is said to be partially aligned with a metal track of another metallization level if, when seen along the stacking direction of the insulating layers, the tracks substantially completely overlap over part of their length only.

In the following description, a half-loop of an inductor may comprise a metal track of a single metallization level or several metal tracks of successive metallization levels which are aligned and connected to one another or almost along their entire length by conductive vias. In both cases, the half-loop is considered to belong to a single loop level. In the following description, call first loop level the loop level for which a half-loop only comprises a track of the first metallization level or comprises tracks of the first metallization levels which are aligned and connected to one another along their entire length or almost along their entire length by conductive vias. Call last loop level the loop level for which a half-loop only comprises a track of the last metallization level or comprises tracks of the last metallization levels which are aligned and connected to one another along their entire length or almost along their entire length by conductive vias. In the following description, two half-loops are said to be aligned when all the metal tracks forming them are aligned.

In the following description, the external or outer end of a portion or of a metal track corresponds to the end of the portion or of the metal track located towards the outside of the inductor and the internal or inner end of a portion or of a metal track corresponds to the end of the portion or of the metal track located towards the inside of the inductor. Further, the external or outer edge of a portion or of a metal track corresponds to the lateral edge of the portion or of the metal track located towards the outside of the inductor.

FIG. 1 is a simplified perspective view of the metal tracks of an embodiment of an inductor 10 comprising two loops per loop level over two loop levels N1 and N2. The general structure of inductor 10 is described in French patent application 07/56572 (and U.S. patent application Ser. No. 12/218,670 filed by the Applicant on Jul. 17, 2008). In the present example, a circuit comprising seven metallization levels noted M1 to M7, with M1 corresponding to the first metallization level, is considered. First loop level N1 corresponds to metal tracks of the first five metallization levels M1 to M5 and second loop level N2 corresponds to metal tracks of the sixth and seventh metallization levels M6 and M7. In FIG. 1, the vias connecting metal tracks of successive metallization levels are represented by two crosses connected by a dotted line.

In metallization level M7, inductor 10 comprises a track 12 comprising a rectilinear portion 14 forming a main access terminal of inductor 10, portion 14 being continued by a portion 16 substantially having the shape of a half-hexagon and corresponding to a first half-loop. Inductor 10 further comprises a track 18 comprising a rectilinear portion 20 forming another main access terminal of inductor 10, portion 20 being continued by a portion 22 substantially having the shape of a half-hexagon and corresponding to a half-loop, portion 22 being continued, via a connection bridge 24, by a portion 26 substantially having the shape of a half-hexagon and corresponding to a half-loop, portion 26 being continued by a connection portion 28. Portions 16 and 22 are substantially symmetrical with respect to a plane P represented by dotted lines. Portion 26 substantially runs alongside the internal edge of portion 16. Inductor 10 comprises a track 30 substantially having the shape of a half-hexagon and corresponding to a half-loop. Portion 26 and track 30 are substantially symmetrical with respect to plane P.

In metallization level M6, inductor 10 comprises a track 32 comprising a rectilinear portion 34 continued by a portion 36 substantially having the shape of a half-hexagon and corresponding to a half-loop, portion 36 being continued, via a connection bridge 38, by a portion 40 substantially having the shape of a half-hexagon and corresponding to a half-loop, portion 40 being continued by a connection portion 42. Portions 34 and 36 are substantially aligned with portions 14 and 16 and are connected thereto by conductive vias (not shown) along their entire length. Further, portion 40 is substantially aligned with track 30 and is connected thereto by conductive vias (not shown) along its entire length. Inductor 10 further comprises a track 44 comprising a rectilinear portion 46 continued by a portion 48 substantially having the shape of a half-hexagon and corresponding to a half-loop. Portions 46 and 48 are substantially aligned with portions 20 and 22 and are connected thereto along their entire length by conductive vias (three vias 50 being shown as an example between portions 22 and 48). Inductor 10 further comprises a track 52 substantially having the shape of a half-hexagon and corresponding to a half-loop. Track 52 is substantially aligned with portion 26 and is connected thereto by vias along its entire length. Inductor 10 further comprises a connection pad 54 substantially aligned with the free end of connection portion 28 and connected thereto by a via 56. It should be noted that connection bridge 24 is not connected by vias to connection bridge 38.

The tracks of metallization levels M4 and M5 are identical, only the tracks of one of these metallization levels being shown in FIG. 1. Each track of metallization level M5 is aligned with a corresponding track of metallization level M4 and is connected thereto along its entire length by vias. In each metallization level M4 and M5, inductor 10 comprises a track 58 substantially having the shape of a half-hexagon and corresponding to a half-loop. Track 58 is substantially aligned with portion 36. Inductor 10 further comprises a track 60 comprising a portion 62 substantially having the shape of a half-hexagon and corresponding to a half-loop, portion 62 being continued, via a connection bridge 64, by a portion 66 substantially having the shape of a hexagon and corresponding to two half-loops. Portion 62 is substantially aligned with portion 48 and portions 40 and 52 are substantially aligned with portion 66.

The tracks of metallization levels M3, M2, and M1 are identical, only the tracks of one of these metallization levels being shown in FIG. 1. Each track of metallization level M3 is aligned with a corresponding track of metallization level M2 and is connected therewith along its entire length by vias. Similarly, each track of metallization level M2 is aligned with a corresponding track of metallization level M1 and is connected therewith along its entire length by vias. In each metallization level M3, M2, and M1, inductor 10 comprises a track 68 substantially having the shape of a half-hexagon and corresponding to a half-loop. Track 68 of metallization level M3 is substantially aligned with portion 62 of metallization level M4 and is connected therewith along its entire length by vias (three vias 69 being shown as an example). Inductor 10 further comprises a track 70 comprising a portion 72 substantially having the shape of a half-hexagon and corresponding to a half-loop, portion 72 being continued, via a connection bridge 74, by a portion 76 substantially having the shape of a hexagon and corresponding to two half-loops. Portion 72 of metallization level M3 is substantially aligned with track 58 of metallization level M4, to which it is connected along its entire length by vias (not shown). Portion 76 of metallization level M3 is substantially aligned with portion 66 of metallization level M4 to which it is connected along its entire length by vias (not shown). It should be noted that connection bridge 64 is not connected by vias to connection bridge 74.

Pad 54 is connected to the free end of portion 62 by a via 78. Connection portion 42 is connected to an end of track 58 by a via 80.

A disadvantage of inductor 10 is that, in a same loop level, the metal tracks of the different metallization levels associated with the loop level are not aligned and connected together by vias along their entire length. This is true for loop level N2, for connection portions 28 and 42 and connection bridges 24 and 38. This is also true for loop level N1, for connection bridges 64 and 74. Thereby, the surface of the cross-section of the loop is locally reduced, which does not allow the conduction of strong currents. Inductor 10 has a midpoint MI at the intersection of portions 66 and 76 and of plane P. A disadvantage of inductor 10 is that midpoint MI is not located on a loop located on the inductor circumference. Midpoint MI is thus not easily accessible, which may further limit the ability of inductor 10 to conduct strong currents in the case of a differential excitation of the component.

An embodiment of the present invention comprises forming an inductor comprising at least two loop levels and, for each loop level, at least first and second interlaced loops substantially symmetrical with respect to an axis of symmetry parallel to the stacking direction. The first loop is continued, at the end located on the outer side of the inductor, by a portion forming a main access terminal of the inductor and is continued, at the opposite end, by a portion which extends close to the axis of symmetry. The second loop is continued, at the end located on the outer side of the inductor, by a connection portion and is continued, at the opposite end, located on the inner side of the inductor, by a portion which extends close to the axis of symmetry. The tracks of the first loop level correspond, in top view, to the symmetrical of the tracks of the second loop level with respect to a plane P' containing the axis of symmetry. The connection between the loops of the two loop levels is performed, on the one hand, on the inductor circumference and, on the other hand, at the center of the inductor. The interlaced arrangement of the loops ensures, for each loop level, that all the metal tracks of the different metallization levels associated with the loop level are aligned and connected to one another along their entire length. This allows the conduction of strong currents. Further, the symmetry of the inductor enables to obtain an easily-accessible midpoint on the inductor circumference.

FIG. 2 is a simplified perspective of the metal tracks of an embodiment of an inductor 100 comprising two loops per loop level over two loop levels N1 and N2 and FIG. 3 is a partial simplified cross-section view of inductor 100.

In the present embodiment, a circuit comprising tracks of at least seven metallization levels noted M1 to M7 formed at the level of a stacking of insulating layers 104 covering a substrate 105, for example, a substrate of a semiconductor material is considered. First loop level N1 corresponds to metal tracks of the first five metallization levels M1 to M5 and second loop level N2 corresponds to metal tracks of the sixth and seventh metallization levels M6 and M7.

The tracks of metallization levels M6 and M7 are identical. Each track of metallization level M7 is aligned with a corresponding track of metallization level M6 and is connected thereto along its entire length by vias 110. Only the tracks of one of these metallization levels are shown in FIG. 2. In each metallization level M6 and M7, inductor 100 comprises a track 112 comprising a rectilinear portion 114 forming a main access terminal of inductor 100, portion 114 being continued by a portion 116 substantially having the shape of a half-hexagon and corresponding to a first half-loop, portion 116 being continued, via a junction rectilinear portion 117, by a portion 118 substantially having the shape of a half-hexagon and corresponding to a half-loop, portion 118 being continued by a rectilinear portion 120 extending along plane P'. Inductor 100 further comprises a track 122 comprising a rectilinear connection portion 124 substantially perpendicular to rectilinear portion 114 and located on the side opposite to inductor 100 with respect to rectilinear portion 114, portion 124 being continued, via a rectilinear junction portion 125, by a portion 126 substantially having the shape of a half-hexagon and corresponding to a half-loop, portion 126 being continued, via a rectilinear connection portion 127, by a portion 128 substantially having the shape of a half-hexagon and corresponding to a half-loop, portion 128 being continued by a rectilinear connection portion 130 extending along plane P' on the side of plane P' opposite to rectilinear portion 120. Portions 116 and 126 are substantially symmetrical with respect to plane P'. Portions 128 and 118 are substantially symmetrical with respect to plane P'. Portion 126 extends along the outer edge of portion 118. Portion 116 extends along the outer edge of portion 128.

The tracks of metallization levels M1 to M5 are identical. Each track of metallization level M5 is aligned with a corresponding track of metallization level M4, itself aligned with a corresponding track of metallization level M3, etc., all the way to metallization level M1, these tracks being successively connected to one another by vias 131. Only the tracks of one of these metallization levels are shown in FIG. 2. The tracks of metallization level M1 to M5 are the symmetricals, in top view, of the tracks of metallization level M7 (or M6) with respect to plane P'. In each metallization level M1 to M5, inductor 100 comprises a track 132 comprising a rectilinear portion 134, forming another main access terminal of inductor 100, portion 134 being continued by a portion 136 substantially having the shape of a half-hexagon and corresponding to a half-loop, portion 136 being continued, via a rectilinear junction portion 137, by a portion 138 substantially having the shape of a half-hexagon and corresponding to a half-loop, portion 138 being continued by a rectilinear connection portion 140 extending along plane P'. Inductor 100 also comprises a metal track 142 comprising a rectilinear portion 144 substantially perpendicular to rectilinear portion 134 and located on the side opposite to inductor 100 with respect to rectilinear portion 134, portion 144 being continued, via a junction rectilinear portion 145, by a portion 146 substantially having the shape of a half-hexagon and corresponding to a half-loop, portion 146 being continued, via a rectilinear connection portion 147, by a portion 148 substantially having the shape of a half-hexagon and corresponding to a half-loop, portion 148 being continued by a rectilinear connection portion 150 substantially extending along plane P' on the side of plane P' opposite to rectilinear portion 140.

Portion 126 is substantially aligned with portion 136. Portion 118 is substantially aligned with portion 148. Portion 116 is substantially aligned with portion 146. Portion 128 is substantially aligned with portion 138. The end of portion 130 is aligned with the end of portion 140. The end of portion 120 is aligned with the end of portion 150. The end of rectilinear portion 124 is aligned with the end of portion 144.

The end of rectilinear portion 120 of metallization level M6 is connected to the end of rectilinear portion 150 of metallization level M5 by a via 152. The end of rectilinear portion 130 of metallization level M6 is connected to the end of rectilinear portion 140 of metallization level M5 by a via 154. The end of rectilinear portion 124 of metallization level M6 is connected to the end of rectilinear portion 144 of metallization level M5 by a via 156.

Considering that the current starts its progression from access terminal 114, the current then successively runs through portions 116, 117, 118, and 120. Then, through via 152, the current successively runs through portions 150, 148, 147, 146, 145, and 144. Then, through via 156, the current successively runs through portions 124, 125, 126, 127, 128, and 130. Then, through via 154, the current successively runs through portions 140, 138, 137, 136 to reach access terminal 134.

As an example, the tracks of metallization level M7 may be made of aluminum and the tracks of metallization levels M1 to M6 may be made of copper. For a MOS transistor manufacturing process for which the channel length of the MOS transistors is 130 nm, the tracks of metallization level M7 may have a thickness on the order of 1.2 µm, the tracks of metallization level M6 may have a thickness on the order of 0.9 µm, the tracks of metallization levels M2 to M5 may have a thickness on the order of 0.35 µm, and the tracks of metallization level M1 may have a thickness on the order of 0.22 µm. The width of the tracks of the different metallization levels may be of several micrometers.

FIG. 3 is a simplified cross-section view of inductor 100 in a plane parallel to the stacking direction at the level of tracks 116 and 146. As shown in the drawing, when the track width is greater than some ten micrometers, for example, 12 µm, for at least some metallization levels, a track may be formed by one or several adjacent parallel tracks 146', 146".

The present embodiment enables to obtain an inductor 100 of high inductance, for example, on the order of a few tens of nanohenries, which takes up a decreased surface area. Inductor 100 further enables to obtain a midpoint MI' at the junction between portions 124 and 144, that is, located on the circumference of inductor 100. The access to midpoint MI' is thus advantageously eased.

In summary, with reference to FIGS. 2 and 3, there is disclosed: An inductor (100) formed in a stacking of insulating layers (104), the inductor comprising first and second access terminals (114, 134), at least first and second interlaced loops formed by portions (136, 138, 146, 148) on a first level (N1), and at least third and fourth interlaced loops formed by portions (116, 118, 126, 128) on a second level (N2) distinct from the first level (N1), the third loop formed by portions (116, 118) being, as seen along the stacking direction, the symmetrical of the first loop formed by portions (136, 138) with respect to a plane (P') and the fourth loop formed by portions (126, 128) being, as seen along the stacking direction, the symmetrical of the second loop formed by portions (146, 148) with respect to said plane, the internal ends of the first and second loops being connected to the internal ends of the third and fourth loops, the external ends of the first and third loops being connected to the first and second access terminals, and the external ends of the second and fourth loops being interconnected.

Figure 4:
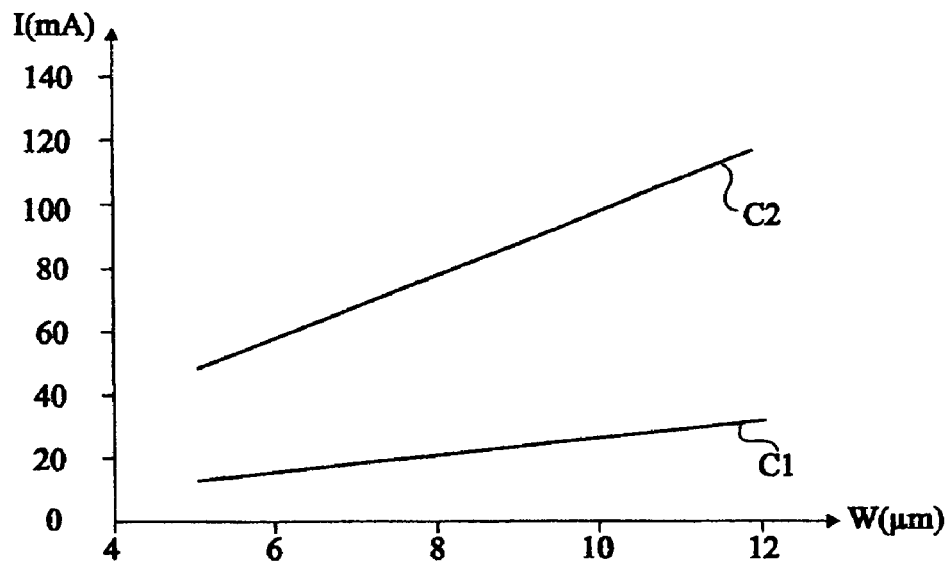
FIG. 4 shows curves of the variation of the intensity of the maximum current likely to be conducted by the inductors of FIGS. 1 and 2 according to the width of the conductive tracks.

FIG. 4 shows two curves C1 and C2 of the variation of the maximum intensity of the current at 125° C., likely to be respectively conducted by inductors 10 and 100 according to the width of the metal tracks forming these inductors. This drawing shows that, for a same conductive track width, inductor 100 allows the conduction of a current of higher intensity than inductor 10. As an example, for a track width on the order of 12 μm, inductor 100 enables the conduction of a current on the order of 120 mA at 125° C. while inductor 10 only allows the conduction of a 30-mA current.

Figure 5:
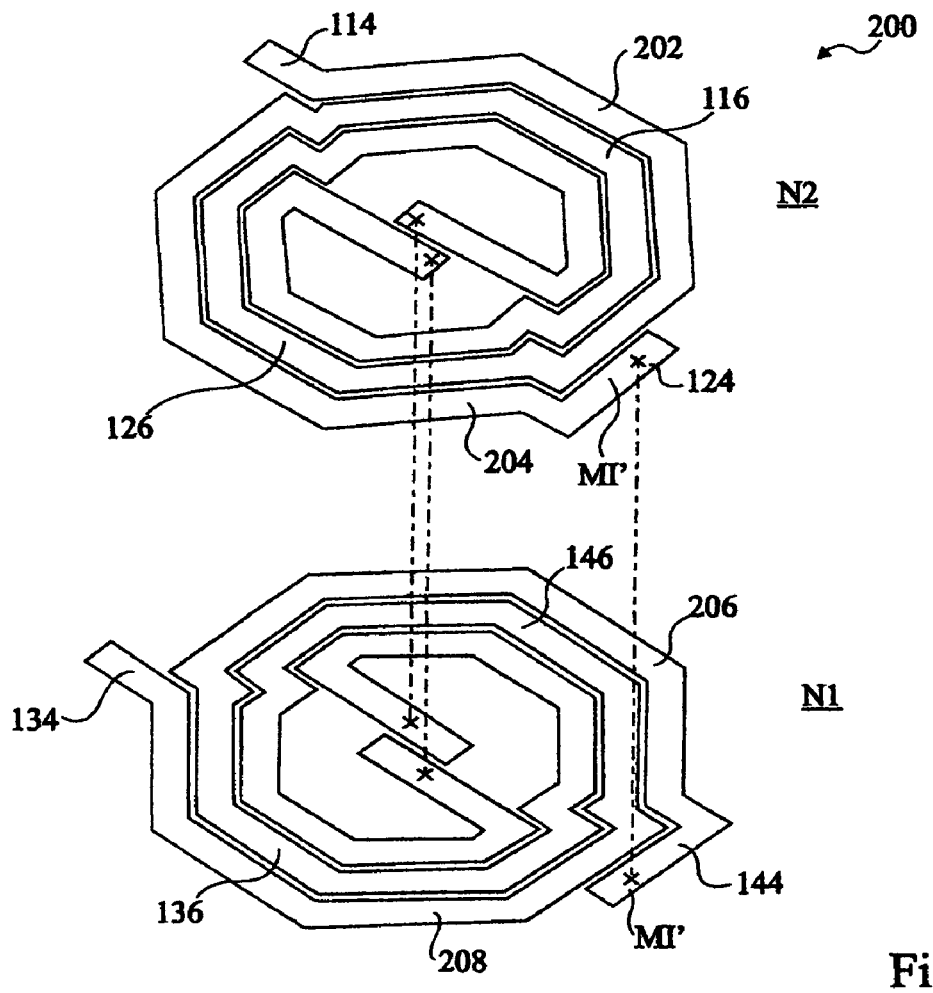
FIG. 5 is a view similar to FIG. 2 of another embodiment of an inductor according to the present invention.

FIG. 5 is a simplified perspective view of the metal tracks of another embodiment of an inductor 200 comprising three loops per loop level over two loop levels N1 and N2. Inductor 200 can be obtained from inductor 100, since it shares the most part of its structure. Indeed, to obtain inductor 200 from inductor 100, the end of portion 126 located towards the outside of inductor 200 is continued in loop level N2 by a portion 202 having the shape of a half-hexagon and forming a half-loop, portion 202 being continued by a rectilinear portion 114 forming an access terminal of the inductor. Further, the end of portion 116 located towards the outside of inductor 200 is continued by a portion 204 having the shape of a half-hexagon and forming a half-loop continued by rectilinear conduction portion 124. Portion 202 extends along the outer edge of portion 116. Portion 204 extends along the outer edge of portion 126. Thus, with respect to loop level N2 of inductor 100, two half-loops, that is, one loop, have been added in loop level N2 of inductor 200.

In loop level N1, the end of portion 136 located towards the outside of inductor 200 is continued by a portion 206 having the shape of a half-hexagon, and forming a half-loop, portion 206 being continued by rectilinear connection portion 144. The end of portion 146 located towards the outside of inductor 200 is continued by a portion 208 having the shape of a half-hexagon and forming a half-loop, portion 208 being continued by rectilinear portion 134 forming another access terminal of inductor 200. Thereby, two half-loops have been added in loop level N1 of inductor 200 with respect to loop level N1 of inductor 100. Midpoint MI' is located, in the same way as for inductor 100, at the junction between portions 124 and 144.

Generally, to increase the number of loops per level of the inductor according to the present embodiment of the present invention, it is sufficient to continue each external end of the inductor by one or several half-loops.

Specific embodiments of the present invention have been described. Various alterations and modifications will occur to those skilled in the art. In particular, although the shown loops have the shape of hexagons, they may have different shapes, for example, circular or rectangular. Further, although in the previously-described examples, each inductor is formed by the tracks of seven metallization levels, it should be clear that the number of metallization levels may be different. As an example, each loop level may comprise tracks of a single metallization level.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An inductor formed in a stacking of insulating layers, the inductor comprising:
   first and second access terminals,
   at least first and second interlaced loops on a first level (N1), and
   at least third and fourth interlaced loops on a second level (N2) distinct from the first level,
      the third loop being, as seen along the stacking direction, symmetrical with the first loop with respect to a plane (P') and
      the fourth loop being, as seen along the stacking direction, symmetrical with the second loop with respect to said plane,
      internal ends of the first and second loops being connected to internal ends of the third and fourth loops,
      external ends of the first and third loops being connected to the first and second access terminals, and
      the external ends of the second and fourth loops being interconnected.

2. The inductor of claim 1, comprising a midpoint (M') at a junction connecting the external end of the second and fourth loops.

3. The inductor of claim 1, wherein
   the first loop comprises a first internal end and a second external end,
   the second loop comprising a third internal end and a fourth external end and
   the third loop comprising a fifth internal end and a sixth external end and
   the fourth loop comprises a seventh internal end and an eighth external end and wherein
      the first end is connected to the seventh end,
      the second end being connected to the first access terminal,
      the third end being connected to the fifth end,
      the fourth end being connected to the eight end and
      the sixth end being connected to the second access terminal.

4. The inductor of claim 3,
   wherein the fourth end of the second loop is located opposite to the first access terminal with respect to the center of the inductor and
   wherein the eighth end of the fourth loop is located opposite to the second access terminal with respect to the center of the inductor.

5. The inductor of claim 1, comprising metal tracks of at least one first and one second metallization level (M4, M5), the inductor further comprising:
   in the first metallization level (M4):
      a first portion forming a first half-loop and connected to the first access terminal;
      a second portion forming a second half-loop and connected to the first portion;
      a third portion forming, a third half-loop, symmetrical to the first portion with respect to said plane (P') and extending along the external edge of the second portion and
      a fourth portion forming a fourth half-loop, symmetrical to the second portion with respect to said plane, the first portion extending along the external edge of the fourth portion; and
   in the second metallization level (M5):

a fifth portion forming a fifth half-loop and connected to the second access terminal;

a sixth portion forming a sixth half-loop and connected to the fifth portion;

a seventh portion forming a seventh half-loop, symmetrical to the fifth portion with respect to said plane and extending along the external edge of the sixth portion; and an eighth portion forming an eighth half-loop, symmetrical to the sixth portion with respect to said plane, the fifth portion extending along the external edge of the eighth portion.

6. The inductor of claim 5, wherein the first portion is, along the stacking direction, aligned with the seventh portion, the second portion being aligned with the eighth portion, the third portion (146) being aligned with the fifth portion, and the fourth portion (148) being aligned with the sixth portion.

7. The inductor of claim 5, wherein the second portion is connected to a first rectilinear portion extending along said plane (P'), on one side of said plane, all the way to the central portion of the inductor and wherein the fourth portion is connected to a second rectilinear portion extending along said plane, on the side opposite to said plane, all the way to the central portion of the inductor.

8. The inductor of claim 1, wherein a metallization level (M1-M7) from among several metallization levels is associated with each insulating layer, at least one of a first half-loop and a second half-loop comprising at least two tracks of different metallization levels aligned along the stacking direction of the insulating layers and connected to each other along their entire length.

9. An electronic device, comprising an inductor formed in a stacking of insulating layers, the inductor comprising:

first and second access terminals, at least first and second interlaced loops on a first level (N1), and at least third and fourth interlaced loops on a second level (N2) distinct from the first level, the third loop being, as seen along the stacking direction, symmetrical with the first loop with respect to a plane (P') and the fourth loop being, as seen along the stacking direction, symmetrical with the second loop with respect to said plane, internal ends of the first and second loops being connected to internal ends of the third and fourth loops, external ends of the first and third loops being connected to the first and second access terminals, and the external ends of the second and fourth loops being interconnected.

10. The electronic device of claim 9, wherein the inductor is formed in an integrated circuit.

* * * * *